United States Patent
In et al.

(10) Patent No.: US 8,994,461 B1
(45) Date of Patent: Mar. 31, 2015

(54) SENSOR SIGNAL PROCESSING USING CASCADE COUPLED OSCILLATORS

(71) Applicants: Visarath In, Chula Vista, CA (US);
Patrick Longhini, San Diego, CA (US);
Yong (Andy) Kho, Chula Vista, CA (US); Antonio Palacios, San Diego, CA (US)

(72) Inventors: Visarath In, Chula Vista, CA (US);
Patrick Longhini, San Diego, CA (US);
Yong (Andy) Kho, Chula Vista, CA (US); Antonio Palacios, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/037,546

(22) Filed: Sep. 26, 2013

(51) Int. Cl.
*H03K 3/03* (2006.01)

(52) U.S. Cl.
CPC .................................. *H03K 3/0315* (2013.01)
USPC ................... 331/57; 331/44; 331/46; 331/50; 331/56

(58) Field of Classification Search
CPC ..... H03K 3/0315; H03K 3/0322; H03K 3/03; G01R 29/12; G01R 33/00; G01R 33/0023; G01R 33/0094; G01R 33/093
USPC ......... 331/57, 44, 46, 47, 50, 56; 324/457, 72
See application file for complete search history.

(56) References Cited

U.S. PATENT DOCUMENTS

| 5,475,344 | A | 12/1995 | Maneatis |
| 6,104,253 | A | 8/2000 | Hall |
| 6,683,504 | B1 * | 1/2004 | Abernathy ...................... 331/57 |
| 7,196,590 | B1 | 3/2007 | In |
| 7,714,671 | B1 * | 5/2010 | In et al. .......................... 331/57 |
| 7,777,535 | B1 | 8/2010 | In |
| 8,049,570 | B1 | 11/2011 | In |
| 8,212,569 | B1 | 7/2012 | In |

OTHER PUBLICATIONS

In et al., Coupling-induced oscillations in overdamped bistable systems, Physical Review E, vol. 68, No. 045102, Oct. 14, 2003, pp. 1-4.
Bulsara et al., Emergent oscillations in unidirectionally coupled overdamped bistable systems, Physical Review E, vol. 70, No. 036103, Sep. 3, 2004, pp. 1-12.
In et al., Complex behavior in driven unidirectionally coupled overdamped Duffing elements, Physical Review E, vol. 73, No. 066121, Jun. 19, 2006, pp. 1-9.

(Continued)

*Primary Examiner* — Ryan Johnson
(74) *Attorney, Agent, or Firm* — SPAWAR Systems Center Pacific; Kyle Eppele; Stephen E. Baldwin

(57) ABSTRACT

A cascaded oscillator array includes a first oscillator array and a second oscillator array. The first oscillator array includes at least three oscillator elements coupled unidirectionally in a first ring such that the first oscillator array outputs a first oscillating signal. Each of the at least three oscillator elements is coupled to receive a signal from a sensing element. The second oscillator array includes at least three oscillator elements coupled unidirectionally in a second ring such that the second oscillator array outputs a second oscillating signal. A first number of the at least three oscillator elements of the first oscillator array is the same as a second number of the at least three oscillator elements of the second oscillator. Each oscillator element of the at least three oscillator elements of the second oscillator array is coupled to receive an output signal from a single oscillator element of the at least three oscillator elements of the first oscillator.

20 Claims, 12 Drawing Sheets

(56) References Cited

OTHER PUBLICATIONS

In et al., Complex dynamics in unidirectionally coupled overdamped bistable systems subject to a timeperiodic external signal, Physical Review E vol. 72, No. 045104, Oct. 25, 2005, pp. 1-4.

Longhini et al., Exploiting dynamical symmetry in coupled nonlinear elements for efficient frequency down-conversion, Physical Review E, vol. 76, No. 026201, Aug. 1, 2007, pp. 1-6.

* cited by examiner

SENSOR SIGNAL PROCESSING USING CASCADE COUPLED OSCILLATORS

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619)553-5118; email: ssc_pac_t2@navy.mil. Reference Navy Case No. 102215.

BACKGROUND

A broad class of sensors such as magnetic sensors (i.e., superconducting quantum interference devices and fluxgate magnetometers), electric field sensors, and microelectromechanical systems gyroscopes are inherently nonlinear systems. At the core of many of these sensing applications is the need to discern minute electrical current changes. In principle, a device can take advantage of a system nonlinearity to improve a sensing system's performance such as the detection of a minute electrical current or voltage change.

SUMMARY

In an illustrative embodiment, a cascaded oscillator array is provided. The cascaded oscillator includes, but is not limited to, a first oscillator array and a second oscillator array. The first oscillator array includes at least three oscillator elements coupled unidirectionally in a first ring such that the first oscillator array outputs a first oscillating signal. Each of the at least three oscillator elements is coupled to receive a signal from a sensing element. The second oscillator array includes at least three oscillator elements coupled unidirectionally in a second ring such that the second oscillator array outputs a second oscillating signal. A first number of the at least three oscillator elements of the first oscillator array is the same as a second number of the at least three oscillator elements of the second oscillator. Each oscillator element of the at least three oscillator elements of the second oscillator array is coupled to receive an output signal from a single oscillator element of the at least three oscillator elements of the first oscillator.

Other principal features of the disclosed subject matter will become apparent to those skilled in the art upon review of the following drawings, the detailed description, and the appended claims.

BRIEF DESCRIPTION OF THE DRAWINGS

Illustrative embodiments of the disclosed subject matter will hereafter be described referring to the accompanying drawings, wherein like numerals denote like elements.

DETAILED DESCRIPTION

Figure 1:
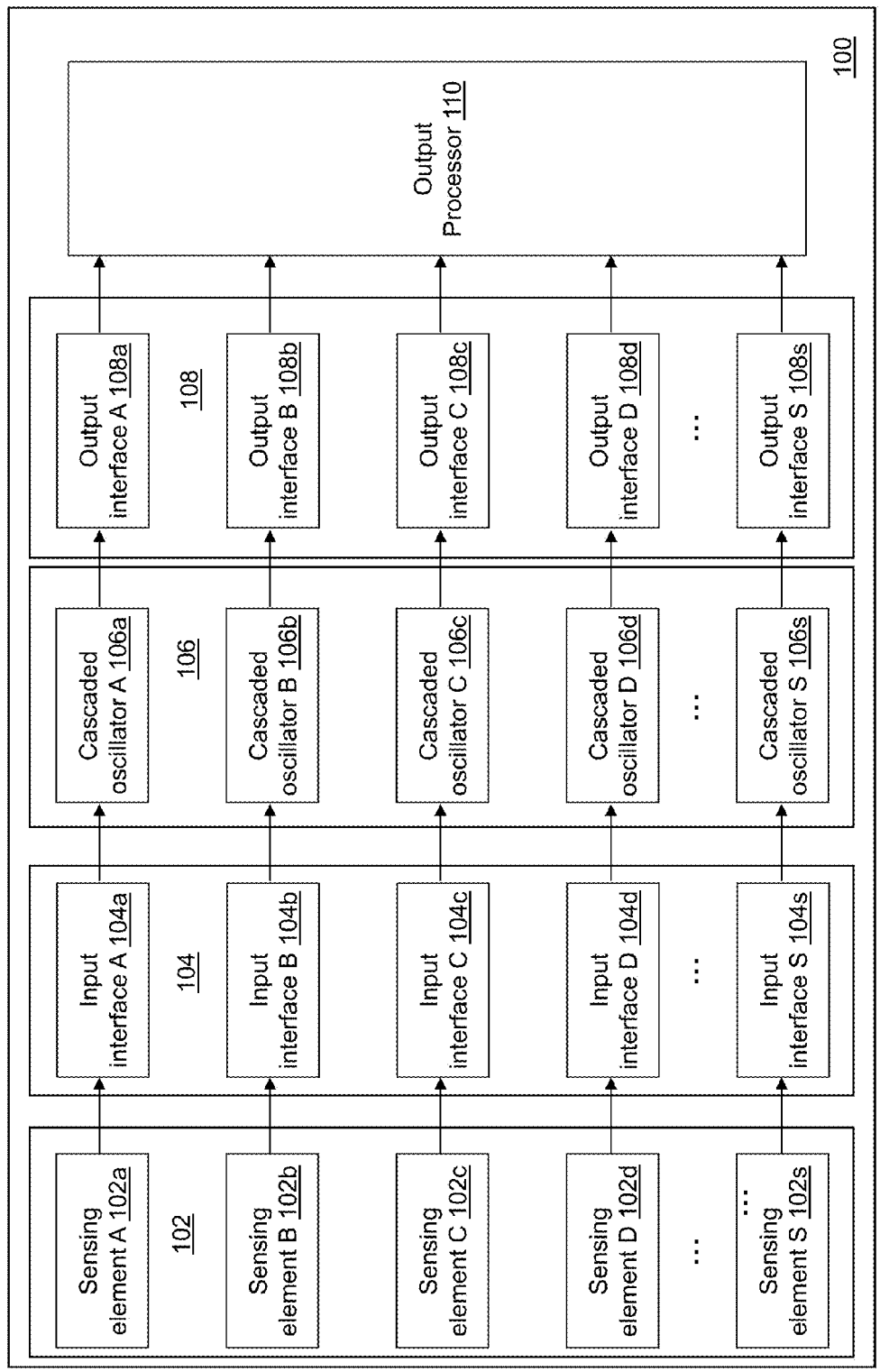
FIG. 1 depicts a block diagram of a sensing system in accordance with an illustrative embodiment.

Many nonlinear bistable dynamical systems are highly sensitive to small external perturbations. With reference to FIG. 1, a block diagram of a sensing system 100 is shown in accordance with an illustrative embodiment. Sensing system 100 may include a plurality of sensing elements 102, a plurality of input interfaces 104, a plurality of cascaded oscillators 106, a plurality of output interfaces 108, and an output processor 110. One or more of the components of sensing system 100 may be formed on one or more microchips, on one or more printed circuit boards, etc.

A cascaded oscillator, such as a cascaded oscillator A 106a of the plurality of cascaded oscillators 106, includes an N-element nonlinear oscillator, where N is usually odd. The N-element nonlinear oscillator has an intrinsic bistable property. If the N-element nonlinear oscillator is biased at an onset of bifurcation and is perturbed with a small current (from an input interface, such as an input interface A 104a of the plurality of input interfaces 104), a large change in the output characteristics, such as frequency, duty cycle, etc. can result. The N-element nonlinear oscillator is nonlinear with a bifurcation property, such as a Hopf bifurcation or heteroclinic orbit, and is operated near the bifurcation point where it is most sensitive to changes in the control parameter via either a current or a voltage. Once oscillations start in the N-element nonlinear oscillator, small changes in the input electrical current (detection signal from a sensing element, such as a sensing element A 102a, of the plurality of sensing elements 102) change the oscillation characteristics, and the effects are processed to discern the signals of interest by an output interface, such as an output interface A 108a of the plurality of output interfaces 108.

The plurality of sensing elements 102 may include any number and type of sensing elements such as those that collect or sense a multitude of signatures such as a magnetic signature, an electric signature, a seismic signature, an acoustic signature, an infrared signature, a thermal neutron signature, a chemical/biological agent signature, a light signature, a stress signature, a strain signature, etc. Referring to FIG. 1, the plurality of sensing elements 102 includes sensing element A 102a, a sensing element B 102b, a sensing element C 102c, a sensing element D 102d, . . . , and a sensing element S 102s.

Associated with each sensing element of the plurality of sensing elements 102 may be an input interface of the plurality of input interfaces 104. Referring to FIG. 1, the plurality of input interfaces 104 includes input interface A 104a, an input interface B 104b, an input interface C 104c, an input interface D 104d, . . . , and an input interface S 104s. For a particular sensing element, an appropriate interface material to sense the associated signature is used to create a detection signal for input to an associated cascaded oscillator.

In an illustrative embodiment, the detection signal is a DC current. For example, input interface A 104a may be configured to create a DC current from a magnetic signature detected by sensing element A 102a that includes a giant magnetoresistance or anisotropic magnetoresistance material. Input interface B 104b may be configured to create a DC current from an electric signature detected by sensing element B 102b that includes an efficient conductor for sensing a low frequency electric field based on a residual static charge. Input interface C 104c may be configured to create a DC current from a seismic or acoustic signature detected by sensing element C 102c that includes a microresonator. Input interface D 104d may be configured to create a DC current from an infrared signature detected by sensing element D 102d that includes pyroelectric crystals. Input interface S 104s may be configured to create a DC current from a thermal neutron signature detected by sensing element S 102s that includes a film implementation of a neutron detector as described with reference to U.S. Pat. No. 7,745,800. As another example, input interface S 104s may be configured to create a DC current from a light signature detected by sensing element S 102s that includes a photodiode. As another example, input interface S 104s may be configured to create a DC current from a stress signature or a strain signature detected by sensing element S 102s that includes a piezoelectric material.

Associated with each input interface of the plurality of input interfaces 104 may be a cascaded oscillator of the plurality of cascaded oscillators 106. Referring to FIG. 1, the plurality of cascaded oscillators 106 includes cascaded oscillator A 106a, a cascaded oscillator B 106b, a cascaded oscillator C 106c, a cascaded oscillator D 106d, . . . , and a cascaded oscillator S 106s. Each cascaded oscillator includes the N-element nonlinear oscillator biased at the onset of bifurcation such that, when perturbed with a detection signal, a large change in the output characteristics, such as frequency, duty cycle, etc. results. The detection signal may be a DC current or voltage signal or an AC current or voltage signal. In the illustrative embodiments described herein, the detection signal is a DC current. For a DC signal, the cascaded oscillator behaves with consistent oscillations where the amplitude is constant but the frequency and duty cycle is skewed in proportion to the magnitude of the DC signal. When the DC signal is a current, no conversion to voltage via nonlinear capacitors or other media is needed.

Associated with each cascaded oscillator of the plurality of cascaded oscillators 106 may be an output interface of the plurality of output interfaces 108. Referring to FIG. 1, the plurality of output interfaces 108 includes output interface A 108a, an output interface B 108b, an output interface C 108c, an output interface D 108d, . . . , and an output interface S 108s. For example, output interface A 108a may be configured to buffer a differential output from cascaded oscillator A 106a to a single output.

Output processor 110 may be operably coupled to the output from the plurality of output interfaces 108. For example, output processor 110 may include a microprocessor that calculates an output signal from the signals output from the plurality of output interfaces 108. The output signal may be a residence time difference (RTD), a power spectral density calculation, etc. The output signal may be presented using an output device such as a display, a printer, a speaker, etc. as understood by a person of skill in the art.

Figure 2:
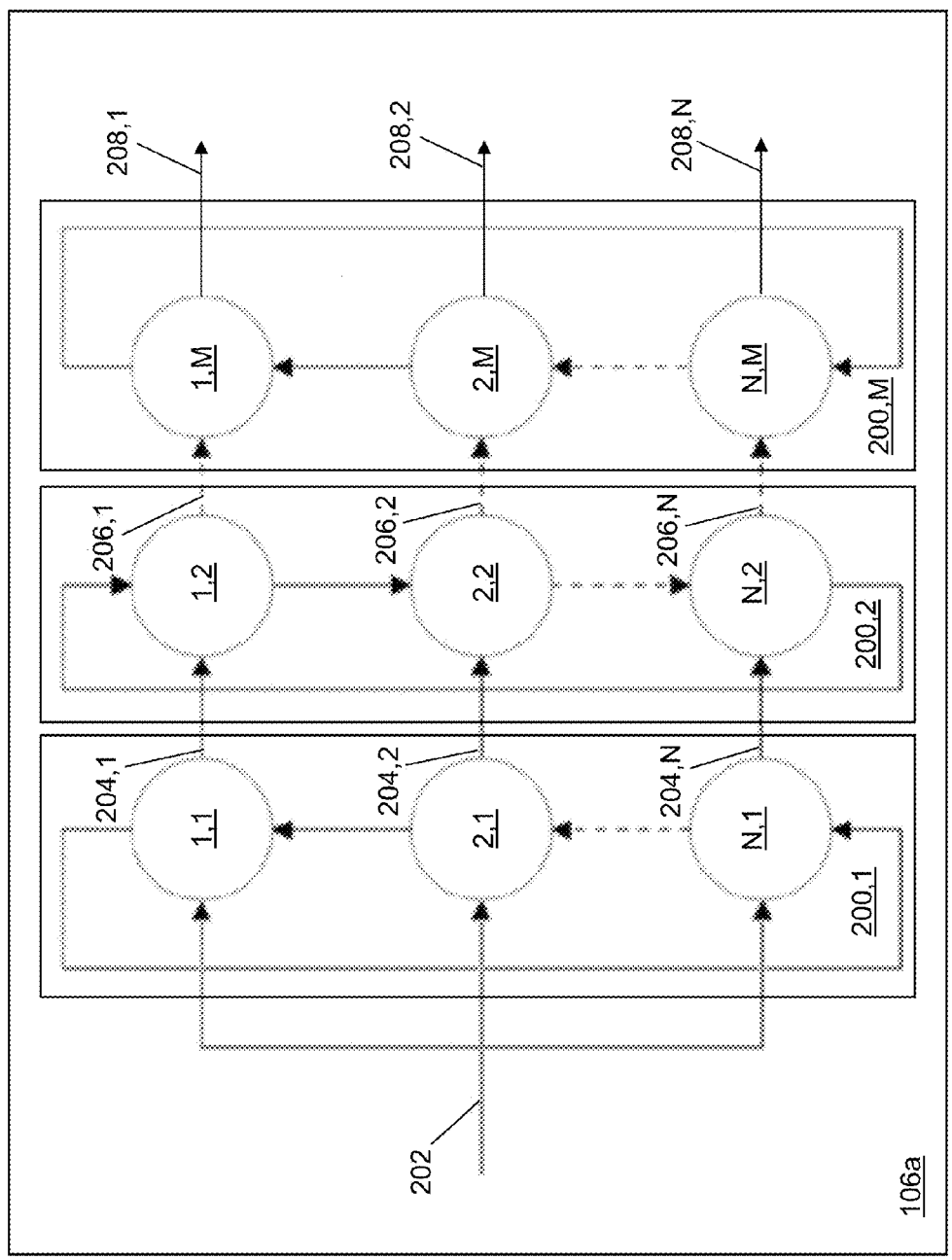
FIG. 2 depicts a block diagram of a cascaded oscillator in accordance with an illustrative embodiment.

With reference to FIG. 2, a block diagram of cascaded oscillator A 106a is shown in accordance with an illustrative embodiment. Cascaded oscillator B 106b, a cascaded oscillator C 106c, cascaded oscillator D 106d, . . . , and cascaded oscillator S 106s may be formed in a similar manner. Cascaded oscillator A 106a may include two to M coupled oscillators. Each oscillator of cascaded oscillator A 106a may include three to N oscillator elements. Cascaded oscillator A 106a may include a first oscillator 200,1, a second oscillator 200,2, . . . , and an Mth oscillator 200,M.

First oscillator 200,1 may include an oscillator element 1,1, an oscillator element 2,1, . . . , and an Nth oscillator element N,1. Second oscillator 200,2 may include an oscillator element 1,2, an oscillator element 2,2, . . . , and an Nth oscillator element N,2. Mth oscillator 200,M may include an oscillator element 1, M, an oscillator element 2, M, . . . , and an Nth oscillator element N, M.

Oscillator element 1,1 is coupled to receive an input signal from oscillator element 2,1 and to output an output signal to Nth oscillator element N,1. Oscillator element 2,1 is coupled to receive an input signal from oscillator element N,1 and to output an output signal to oscillator element 1,1. Oscillator element N,1 is coupled to receive an input signal from oscillator element 1,1 and to output an output signal to oscillator element 2,1. Additional oscillator elements are connected in a similar manner.

Similarly, oscillator element 1,2 is coupled to receive an input signal from oscillator element 2,2 and to output an output signal to Nth oscillator element N,2. Oscillator element 2,2 is coupled to receive an input signal from oscillator element N,2 and to output an output signal to oscillator element 1,2. Oscillator element N,2 is coupled to receive an input signal from oscillator element 1,2 and to output an output signal to oscillator element 2,2.

Similarly, oscillator element 1,M is coupled to receive an input signal from oscillator element 2,M and to output an output signal to Nth oscillator element N,M. Oscillator element 2,M is coupled to receive an input signal from oscillator element N,M and to output an output signal to oscillator element 1,M. Oscillator element N,M is coupled to receive an input signal from oscillator element 1,M and to output an output signal to oscillator element 2,M.

For illustration, a detection signal 202 is received from input interface A 104a that is duplicated and input to each oscillator element of first oscillator 200,1. An output signal 204,1 from oscillator element 1,1 is also input to oscillator element 1,2 of second oscillator 200,2. An output signal 204,2 from oscillator element 2,1 is also input to oscillator element 2,2 of second oscillator 200,2. An output signal 204,N from oscillator element N,1 is also input to oscillator element N,2 of second oscillator 200,2. Similarly, an output signal 206,1 from oscillator element 1,2 is also input to oscillator element 1,M of Mth oscillator 200,M. An output signal 206,2 from oscillator element 2,2 is also input to oscillator element 2,M of Mth oscillator 200,M. An output signal 206,N from oscillator element N,2 is also input to oscillator element N,M of Mth oscillator 200,M.

An output signal 208,1 from oscillator element 1,M may be output to output interface A 108a. An output signal 208,2 from oscillator element 2,M also may be output to output interface A 108a. An output signal 208,N from oscillator element N,M also may be output to output interface A 108a.

The model equation describing the coupled system of first oscillator 200,1 is $$C_L \dot{V}_{1,1} = -gV_{1,1} + I_{s1} \tan h(c_s V_{1,1}) - I_{c1} \tan h(c_c V_{N,1}) - S(t)$$

$$C_L \dot{V}_{2,1} = -gV_{2,1} + I_{s1} \tan h(c_s V_{2,1}) - I_{c1} \tan h(c_c V_{1,1}) - S(t)$$

$$C_L \dot{V}_{3,1} = -gV_{3,1} + I_{s1} \tan h(c_s V_{3,1}) - I_{c1} \tan h(c_c V_{2,1}) - S(t)$$

...

$$C_L \dot{V}_{N,1} = -gV_{N,1} + I_{s1} \tan h(c_s V_{N,1}) - I_{c1} \tan h(c_c V_{N-1,1}) - S(t)$$

S(t) is detection signal 202, $V_{i,i}$ is the differential output of oscillator element i, i, g=1/R and $C_L$ is a load capacitance of cascaded oscillator A 106a. The value of $C_L$ is typically chosen such that it is greater than the total parasitic capacitance, $C_P$, at the nodes (i.e. $C_L \gg 10 C_P$). The parameters, $I_{s1}$ and $I_{c1}$, are tunable parameters that control the coupling frequency of the oscillations and depth of the system potential well, respectively. $c_s$ and $c_c$ are device parameters defined to correspond to the slope of the hyperbolic transfer function. R may be chosen based on the system dynamics due to a critical point that occurs at $I_{s1} > g/C_s$. For a small input signal, the output is linear such that the output is $c_s$ times the input. For a large signal, the output reaches a maximum value, which is a characteristic of the hyperbolic tan h. For illustration, R=500 ohms and $c_s = c_c = 7$.

The model equation describing the coupled system of second oscillator 200,2 is $$C_L \dot{V}_{1,2} = -gV_{1,2} + I_{s2} \tan h(c_s V_{1,2}) - I_{c2} \tan h(c_c V_{2,2}) - I_{g2} \tan h(c_g V_{1,1})$$

$$C_L \dot{V}_{2,2} = -gV_{2,2} + I_{s2} \tan h(c_s V_{2,2}) - I_{c2} \tan h(c_c V_{3,2}) - I_{g2} \tan h(c_g V_{2,1})$$

$$C_L \dot{V}_{3,2} = -gV_{3,2} + I_{s2} \tan h(c_s V_{3,2}) - I_{c2} \tan h(c_c V_{4,2}) - I_{g2} \tan h(c_g V_{3,1})$$

...

$$C_L \dot{V}_{N,2} = -gV_{N,2} + I_{s2} \tan h(c_s V_{N,2}) - I_{c2} \tan h(c_c V_{1,2}) - I_{g2} \tan h(c_g V_{N,1})$$

The parameters, $I_{s2}$, $I_{c2}$, and $I_{g2}$ are tunable parameters that control the coupling frequency of the oscillations and depth of the system potential well, respectively. $c_g$ is a device parameter. For illustration, $c_g = c_s = c_c$.

The model equation describing the coupled system of Mth oscillator 200,M is $$C_L \dot{V}_{1,M} = -gV_{1,M} + I_{sM} \tan h(c_s V_{1,M}) - I_{cM} \tan h(c_c V_{1+(-1)^M,M}) - I_{gM} \tan h(c_g V_{1,M-1})$$

$$C_L \dot{V}_{2,M} = -gV_{2,M} + I_{sM} \tan h(c_s V_{2,M}) - I_{cM} \tan h(c_c V_{2+(-1)^M,M}) - I_{gM} \tan h(c_g V_{2,M-1})$$

$$C_L \dot{V}_{3,M} = -gV_{3,M} + I_{sM} \tan h(c_s V_{3,M}) - I_{cM} \tan h(c_c V_{3+(-1)^M,M}) - I_{gM} \tan h(c_g V_{3,M-1})$$

...

$$C_L \dot{V}_{N,M} = -gV_{N,M} + I_{sM} \tan h(c_s V_{N,M}) - I_{cM} \tan h(c_c V_{N+(-1)^M,M}) - I_{gM} \tan h(c_g V_{N,M-1})$$

The parameters, $I_{sM}$, $I_{cM}$, and $I_{gM}$ are tunable parameters that control the coupling frequency of the oscillations and depth of the system potential well, respectively.

In the absence of an input (target) signal, the differential output, $V_{i,i}$, is symmetrical in its duty cycle. Thus, during an oscillation period, the time above $V_{i,i}=0$, $t_p$, is approximately the same as the time below $V_{i,i}=0$, $t_n$. It follows that the RTD, which is determined by calculating RTD=$t_p - t_n$, is very small or close to zero. As detection signal 202 increases, the differential output becomes more asymmetrical in its duty cycle resulting in an increase in the RTD magnitude. The sensitivity of cascaded oscillator A 106a is scalable. For example, by increasing the number of oscillator elements in each oscillator and/or increasing the number of oscillators, the sensitivity increases. The cascaded oscillator associated with each sensing element may include a different number of oscillator elements, a different number of oscillators, different tuning parameters, different device parameters, etc. possibly as a function of the associated sensing element of the plurality of sensing elements 102.

Figure 3:
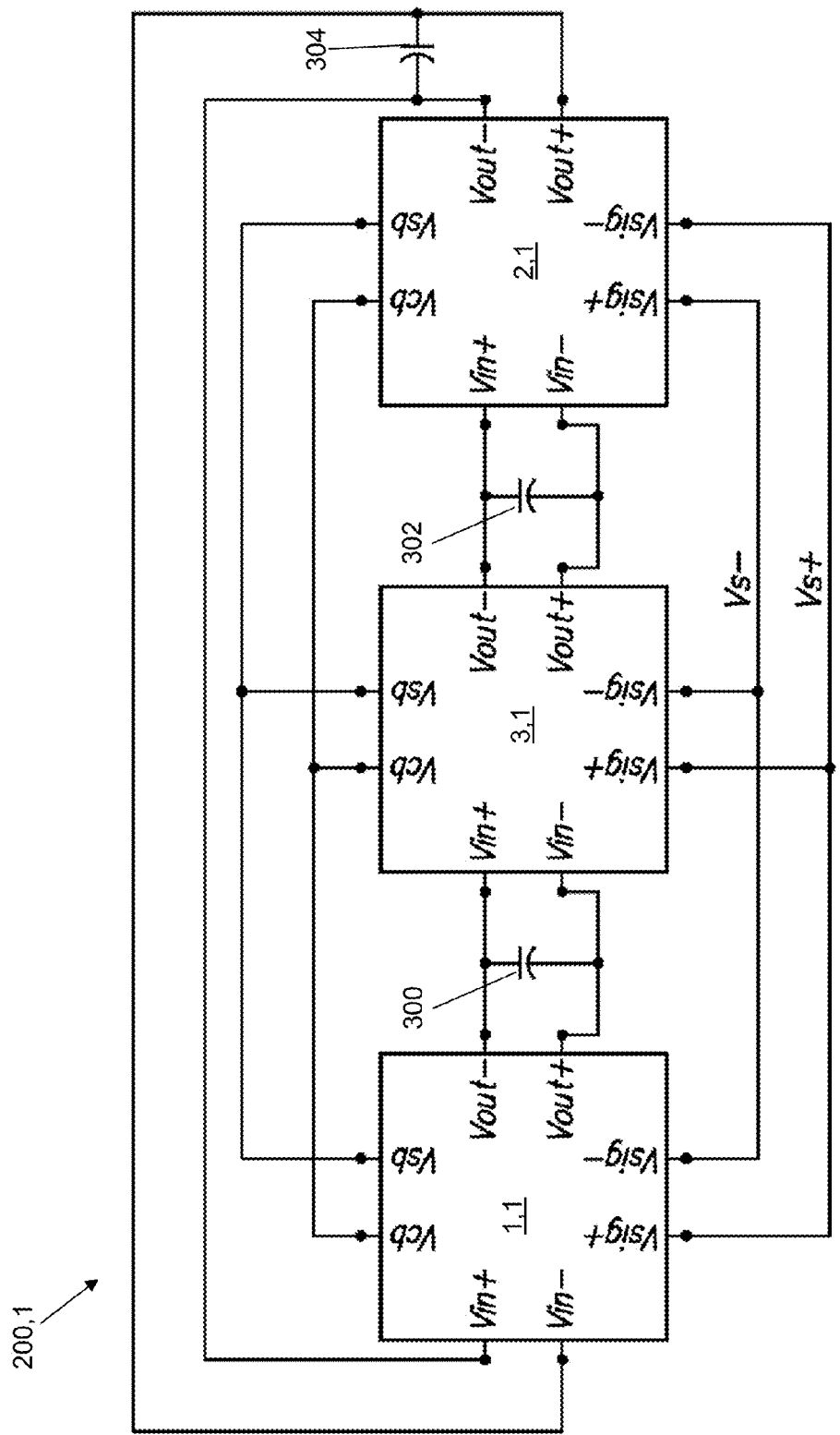
FIG. 3 depicts a block diagram of an oscillator of the cascaded oscillator of FIG. 2 in accordance with an illustrative embodiment.

The oscillators comprise unidirectional coupled, non-linear, over-damped, bistable elements. With reference to FIG. 3, first oscillator 200,1 is shown in accordance with an illustrative embodiment to include oscillator element 1,1, oscillator element 2,1, and an oscillator element 3,1. In the illustrative embodiment, the input to oscillator element 2,1 is of opposite polarity to oscillator element 1,1 and oscillator element 3,1 in the ring formed by first oscillator 200,1 to take advantage of an enhanced asymmetry in the oscillation characteristic, mainly the duty cycle difference of the oscillations. This, in turn, enhances the sensitivity of sensing system 100. In an alternative embodiment, all of the inputs may have the same polarity. In another alternative embodiment, an input to another of the oscillator elements may have an opposite polarity. Oscillator element 1,1, oscillator element 2,1, and oscillator element 3,1 may include fully differential inputs and outputs, as shown in FIG. 3. The alternating input may be continued for a larger N-array.

As discussed previously, detection signal 202, $V_{s-}$, $V_{s+}$, is received from input interface A 104a that is duplicated and input to each oscillator element of first oscillator 200,1 as $V_{sig+}$, $V_{sig-}$. Oscillator element 1,1 is coupled to receive an input signal $V_{in+}$, $V_{in-}$ from an output signal $V_{out+}$, $V_{out-}$ of oscillator element 2,1 and to output an output signal $V_{out+}$, $V_{out-}$ to oscillator element 3,1. Oscillator element 3,1 is coupled to receive an input signal $V_{in+}$, $V_{in-}$ from an output signal $V_{out+}$, $V_{out-}$ of oscillator element 1,1 and to output an output signal $V_{out+}$, $V_{out-}$ to oscillator element 2,1. Oscillator element 2,1 is coupled to receive an input signal $V_{in+}$, $V_{in-}$ from an output signal $V_{out+}$, $V_{out-}$ of oscillator element 3,1. $V_{out+}$, $V_{out-}$ correspond to the differential output $V_{i,i}$ of oscillator element i, i.

A first capacitor 300 may be connected between the differential outputs/inputs of oscillator element 1,1 and oscillator element 3,1. A second capacitor 302 may be connected between the differential outputs/inputs of oscillator element 3,1 and oscillator element 2,1. A third capacitor 304 may be connected between the differential outputs/inputs of oscillator element 2,1 and oscillator element 1,1. First capacitor 300, second capacitor 302, and third capacitor 304 may each have the value $C_L/2$.

Figure 4:
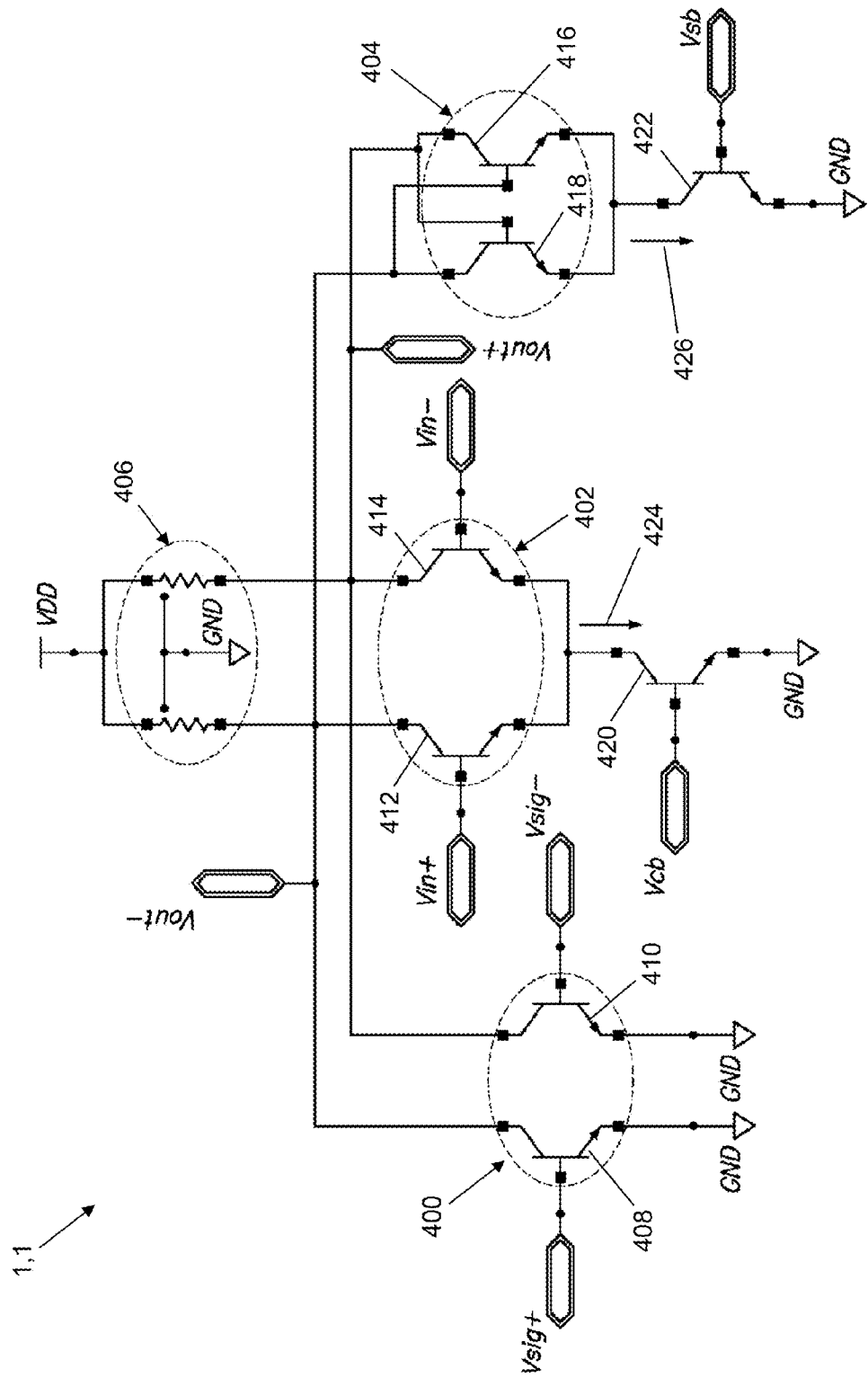
FIG. 4 depicts a circuit diagram of an oscillator element of the oscillator of FIG. 3 in accordance with an illustrative embodiment.

Each of oscillator element 1,1, oscillator element 2,1, and oscillator element 3,1 may comprise a nonlinear, over-damped, bistable element to form the hyperbolic tangent function as the non-linear term by using an operational transconductance amplifier (OTA). With reference to FIG. 4, oscillator element 1,1 is shown in accordance with an illustrative embodiment. Oscillator element 1,1 may include a first OTA 400, a second OTA 402, a third OTA 404, and a resistive load 406. Second OTA 402 may be connected to form a coupling OTA. Third OTA 404 may be connected to form a non-linear OTA.

First OTA 400 may include a first NPN bipolar junction transistor (BJT) 408 and a second BJT 410. Second OTA 402 may include a third BJT 412 and a fourth BJT 414. Third OTA 404 may include a fifth BJT 416 and a sixth BJT 418. First BJT 408 is connected between $V_{out-}$ (collector), $V_{sig+}$ (base), and ground (emitter). Second BJT 410 is connected between $V_{out+}$ (collector), $V_{sig-}$ (base), and ground (emitter). Third BJT 412 is connected between resistive load 406 (collector), $V_{in+}$ (base), and a seventh BJT 420 (emitter). Fourth BJT 414 is connected between resistive load 406 (collector), $V_{in-}$ (base), and seventh BJT 420 (emitter). Fifth BJT 416 is connected between $V_{out+}$ (collector), $V_{out-}$ (base), and an eighth BJT 422 (emitter). Sixth BJT 418 is connected between $V_{out-}$ (collector), $V_{out+}$ (base), and eighth BJT 422 (emitter).

Seventh BJT 420 is connected between second OTA 402, $V_{cb}$, and ground. A first tail current 424, $I_{c1}$, flows between second OTA 402 and seventh BJT 420. Eighth BJT 422 is connected between third OTA 404, $V_{sb}$, and ground. A second tail current 425, $I_{s1}$, flows between third OTA 404 and eighth BJT 422.

Figure 5:
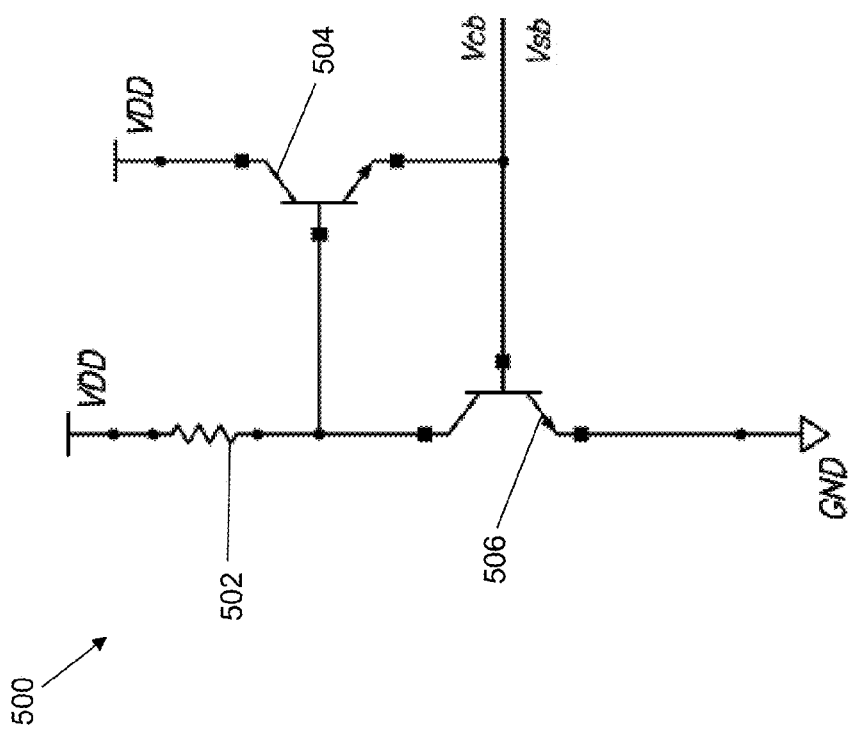
FIG. 5 depicts a circuit diagram of a biasing circuit of the oscillator element of FIG. 4 in accordance with an illustrative embodiment.

$I_{c1}$ and $I_{s1}$ can be set by using a biasing circuit. For illustration, a biasing circuit 500 is shown with reference to FIG. 5 in accordance with an illustrative embodiment. Each element oscillator element may include biasing circuit 500 for each of $I_{c1}$ and $I_{s1}$. Biasing circuit 500 may include resistor 502, a first NPN transistor 504, and a second NPN transistor 506. The base of second NPN transistor 506 is connected to either node $V_{cb}$ or node $V_{sb}$ shown in FIG. 4. Resistor 502 may be an off-chip resistor, which can be replaced by a variable resistor, to set the value of $I_{c1} \cong (V_{DD}-2V_{be})/R_c$ and $I_{s1} \cong (V_{DD}-2V_{be})/R_c$ where $V_{DD}$ is the supply voltage, $V_{be}$ is the forward-biased voltage of the base-emitter junction of first NPN transistor 504 and second NPN transistor 506 (assuming they have the same $V_{be}$), and $R_c$ is the value of resistor 502. $R_c$ may be the same or different for $I_{c1}$ and $I_{s1}$.

In an illustrative embodiment, the transistors forming oscillator element 1,1 are formed of complementary metal oxide semiconductors. The remaining oscillator elements of first oscillator 200,1 may be configured the same as oscillator element 1,1 except possibly with the opposite polarity as indicated in FIG. 3.

Figure 6:
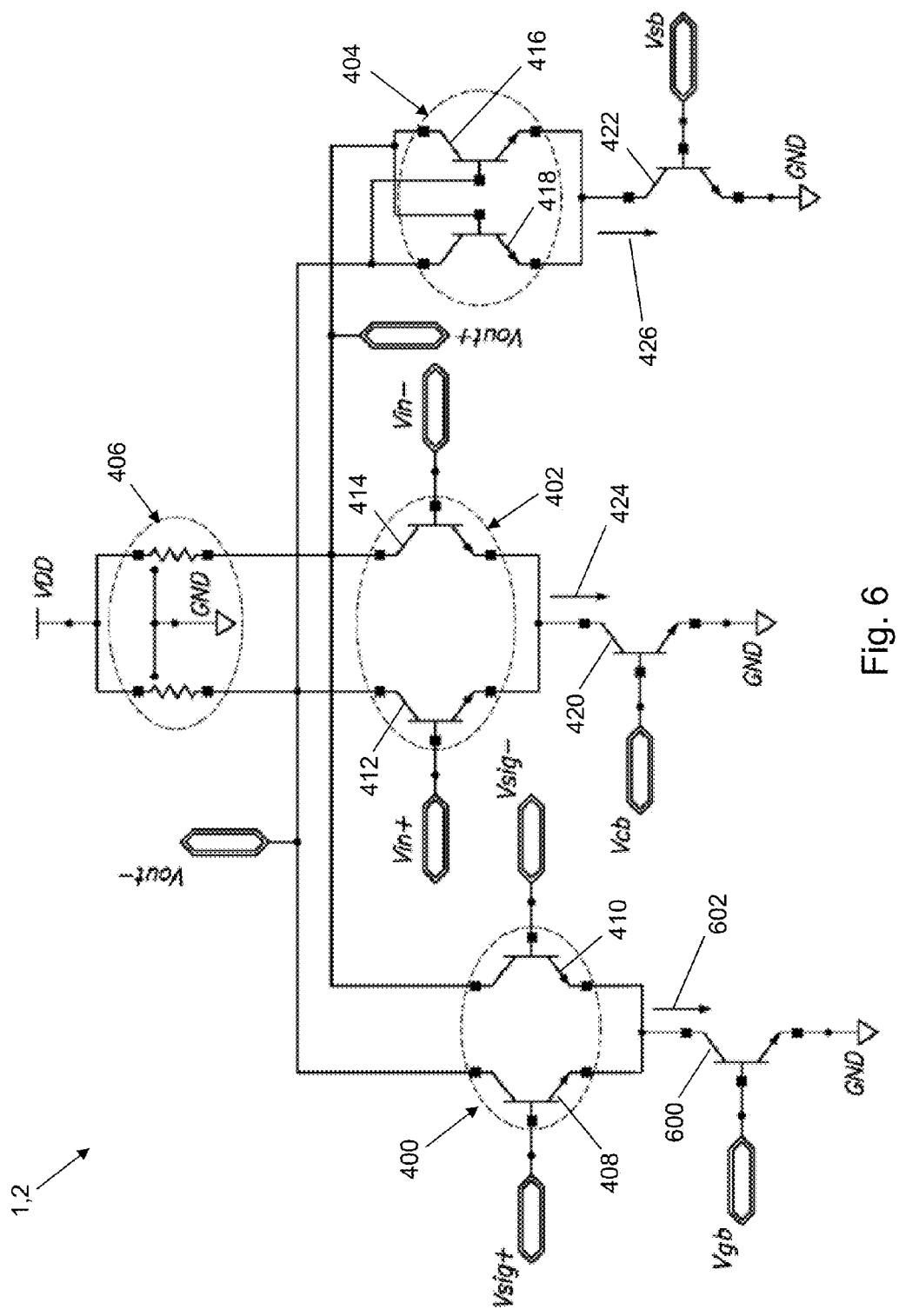
FIG. 6 depicts a circuit diagram of a second oscillator element of the cascaded oscillator of FIG. 2 in accordance with an illustrative embodiment.

With reference to FIG. 6, oscillator element 1,2 is shown in accordance with an illustrative embodiment. Oscillator element 1,2 may include first OTA 400, second OTA 402, third OTA 404, resistive load 406, and a ninth BJT 600. Ninth BJT 600 is connected between first OTA 400 (collector), $V_{gb}$ (base), and ground (emitter). A third tail current 602, $I_{g2}$, flows between first OTA 400 and ninth BJT 600. $I_{g2}$ can be set by using biasing circuit 500. As described with reference to FIG. 5. Each oscillator element may include biasing circuit 500 for $I_{g2}$. $R_c$ may be the same or different for $I_{g2}$ as compared to $I_{c1}$ and $I_{s1}$. $V_{sig+}$ and $V_{sig-}$ for oscillator element 1,2 are $V_{out+}$ and $V_{out-}$ output from oscillator element 1,1 also denoted as $V_{1,1+}$ and $V_{1,1-}$. The remaining oscillator elements of second oscillator 200,2, . . . , Mth oscillator 200,M may be configured the same as oscillator element 1,2, but connected to receive $V_{out+}$ and $V_{out-}$ output from the oscillator element indicated in FIG. 2.

Figure 7:
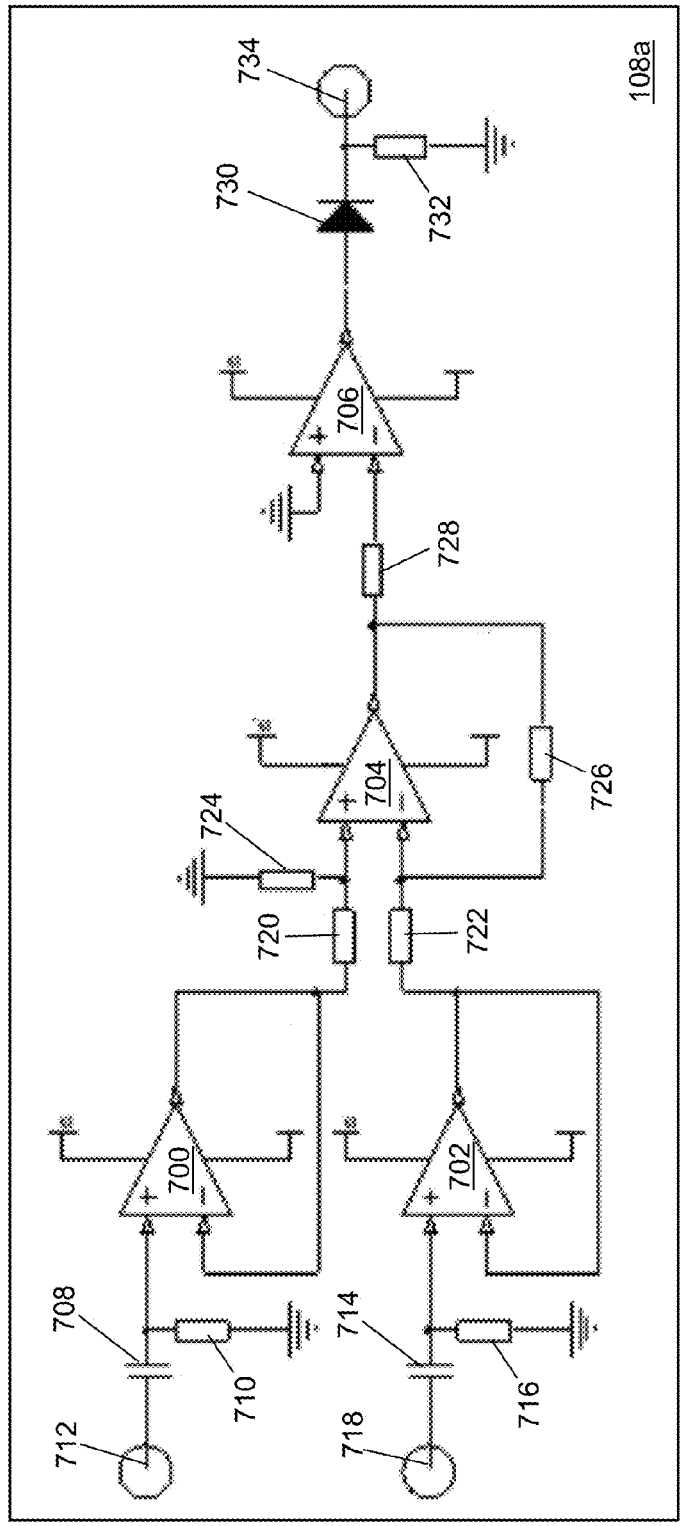
FIG. 7 depicts a circuit diagram of signal conditioning circuit of the sensing system in accordance with an illustrative embodiment.

With reference to FIG. 7, output interface A 108a is shown in accordance with an illustrative embodiment. In the illustrative embodiment, output interface A 108a includes a signal conditioning circuit that buffers the differential outputs from an oscillator element and converts the differential output to a single ended output. Output interface A 108a may include a first operational amplifier 700, a second operational amplifier 702, a third operational amplifier 704, and fourth operational amplifier 706. First operational amplifier 700 receives a first signal 712 through a first capacitor 708 and a first resistor 710 mounted in parallel to ground. Second operational amplifier 702 receives a second signal 718 through a second capacitor 714 and a second resistor 716 mounted in parallel to ground. The output of first operational amplifier 700 is input to third operational amplifier 704 through a third resistor 720 and through a fifth resistor 724 mounted in parallel to ground. The output of second operational amplifier 702 is input to third operational amplifier 704 through a fourth resistor 722 and through a sixth resistor 726 mounted in parallel to the output of third operational amplifier 704. The output of third operational amplifier 704 is input to fourth operational amplifier 706 through a seventh resistor 728. The output of third operational amplifier 704 is input to a diode 730. The output of diode 730 is connected to output 734 through an eighth resistor 732 mounted in parallel to ground. First signal 712 and second signal 718 may be connected from each of the differential outputs of any of the oscillator elements, one at a time. For example, first signal 712 may be $V_{out+}$ from oscillator element 1,M, and second signal 718 may be $V_{out-}$ from oscillator element 1,M and output interface A 108a forms output signal 208,1.

Figure 8:
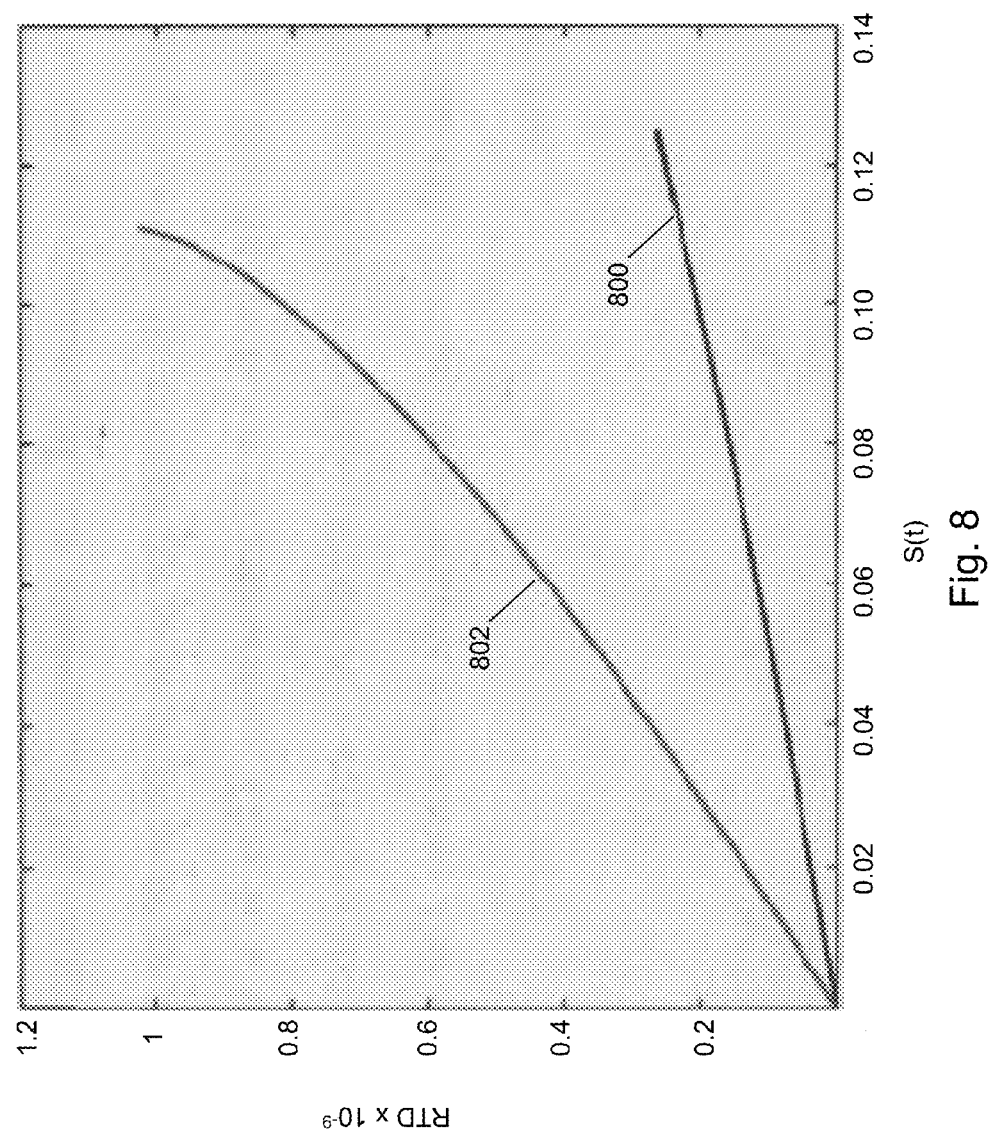
FIG. 8 shows a graph comparing the output of oscillator elements of the sensing system in accordance with an illustrative embodiment.

FIG. 8 shows RTD as a function of an input signal for N=3 oscillator elements and M=2 oscillators with an alternating polarity for the input to oscillator element 2,1 as shown with reference to FIG. 3. A first curve 800 shows output 734 from oscillator element 1,1. A second curve 802 shows output 734 from oscillator element 2,2. The output from oscillator element 2,2 of second oscillator 200,2 shows increased sensitivity.

Figure 9:
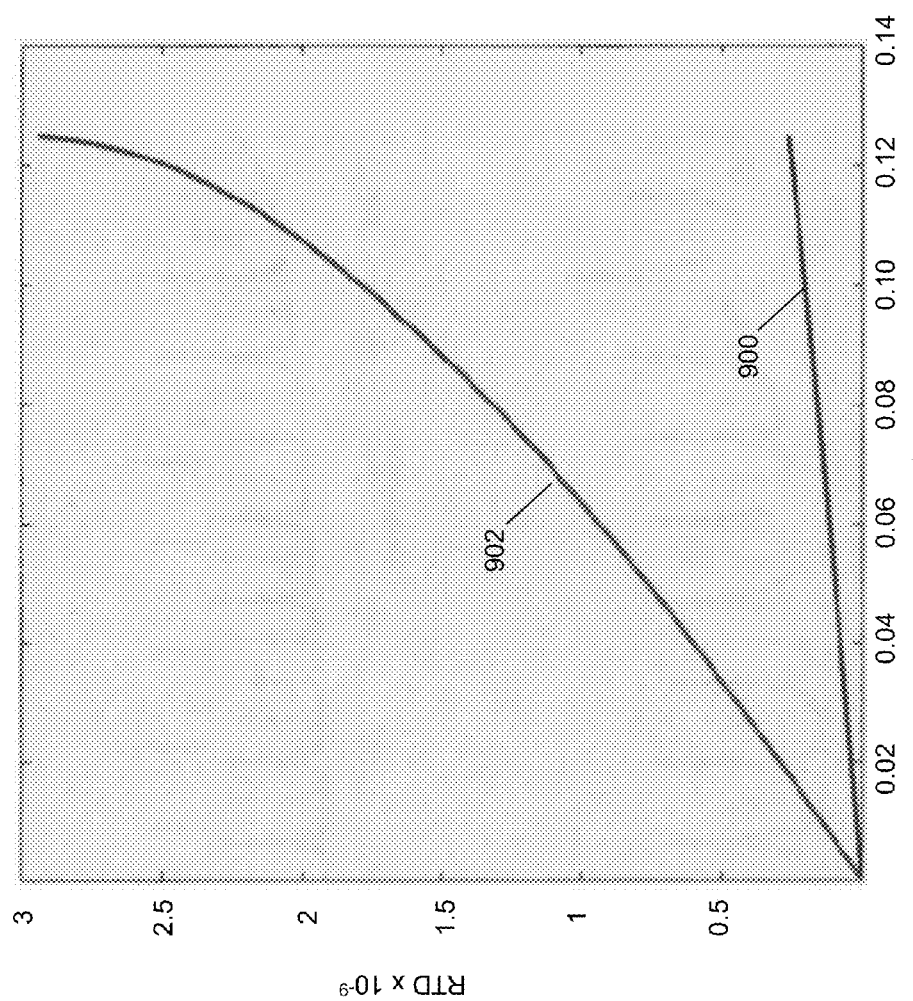
FIG. 9 shows a graph comparing the output of oscillator elements of the sensing system in accordance with a second illustrative embodiment.

FIG. 9 shows RTD as a function of an input signal for N=5 oscillator elements and M=2 oscillators with an alternating polarity for the input to oscillator element 2,1 and to an oscillator element 4,1. A first curve 900 shows output 734 from oscillator element 1,1. A second curve 902 shows output 734 from oscillator element 2,2. The output from oscillator element 2,2 of second oscillator 200,2 shows increased sensitivity.

Figure 10:
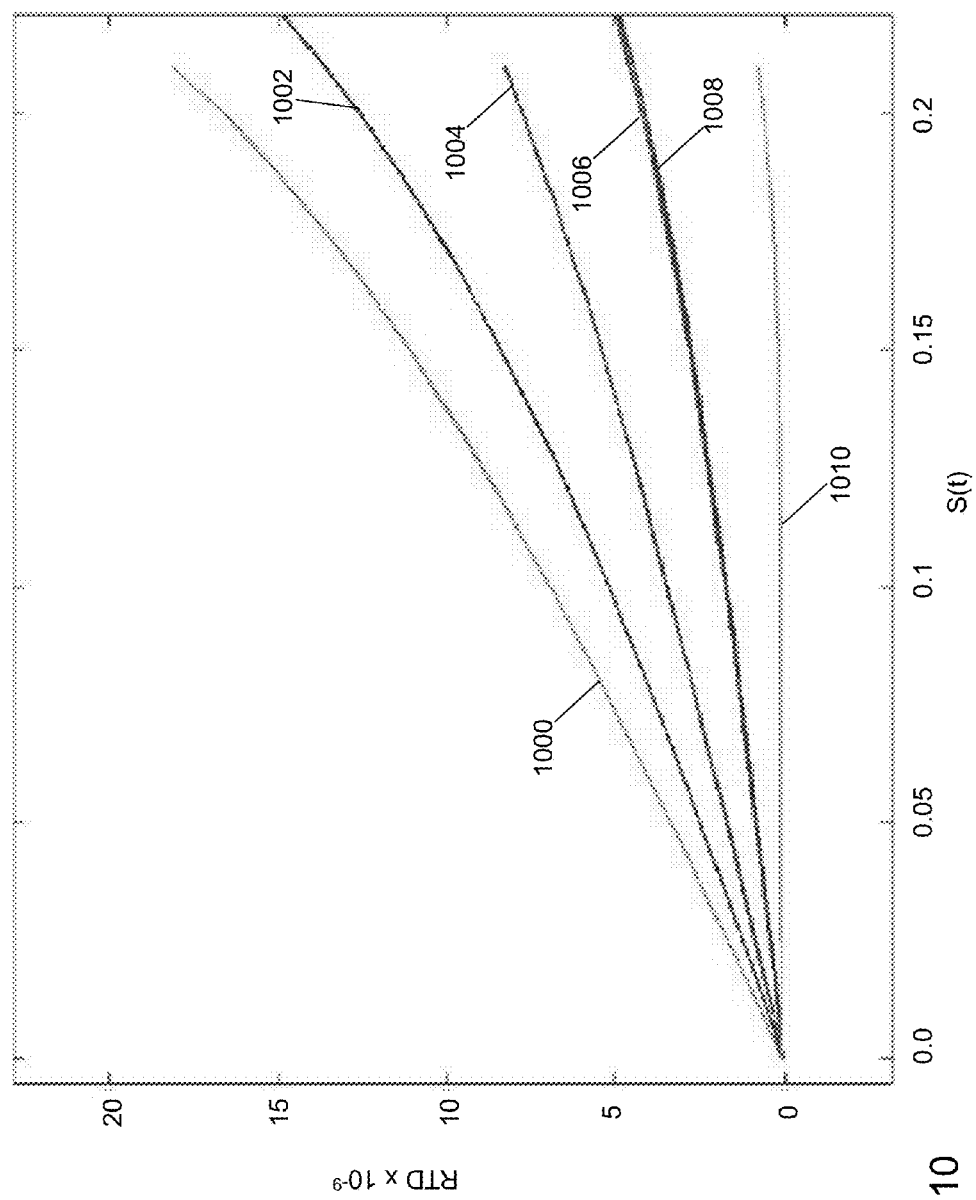
FIG. 10 shows a graph comparing the output of oscillator elements of the sensing system in accordance with a third illustrative embodiment.

FIG. 10 shows RTD as a function of an input signal for N=3 oscillator elements and M=2 oscillators with an alternating polarity for the input to oscillator element 2,1. A first curve 1000 shows output 734 from oscillator element 1,2. A second curve 1002 shows output 734 from oscillator element 1,1. A third curve 1004 shows output 734 from oscillator element 2,2. A fourth curve 1004 shows output 734 from oscillator element 2,1. A fifth curve 1006 shows output 734 from oscillator element 3,1. A sixth curve 1008 shows output 734 from oscillator element 1,3.

Figure 11:
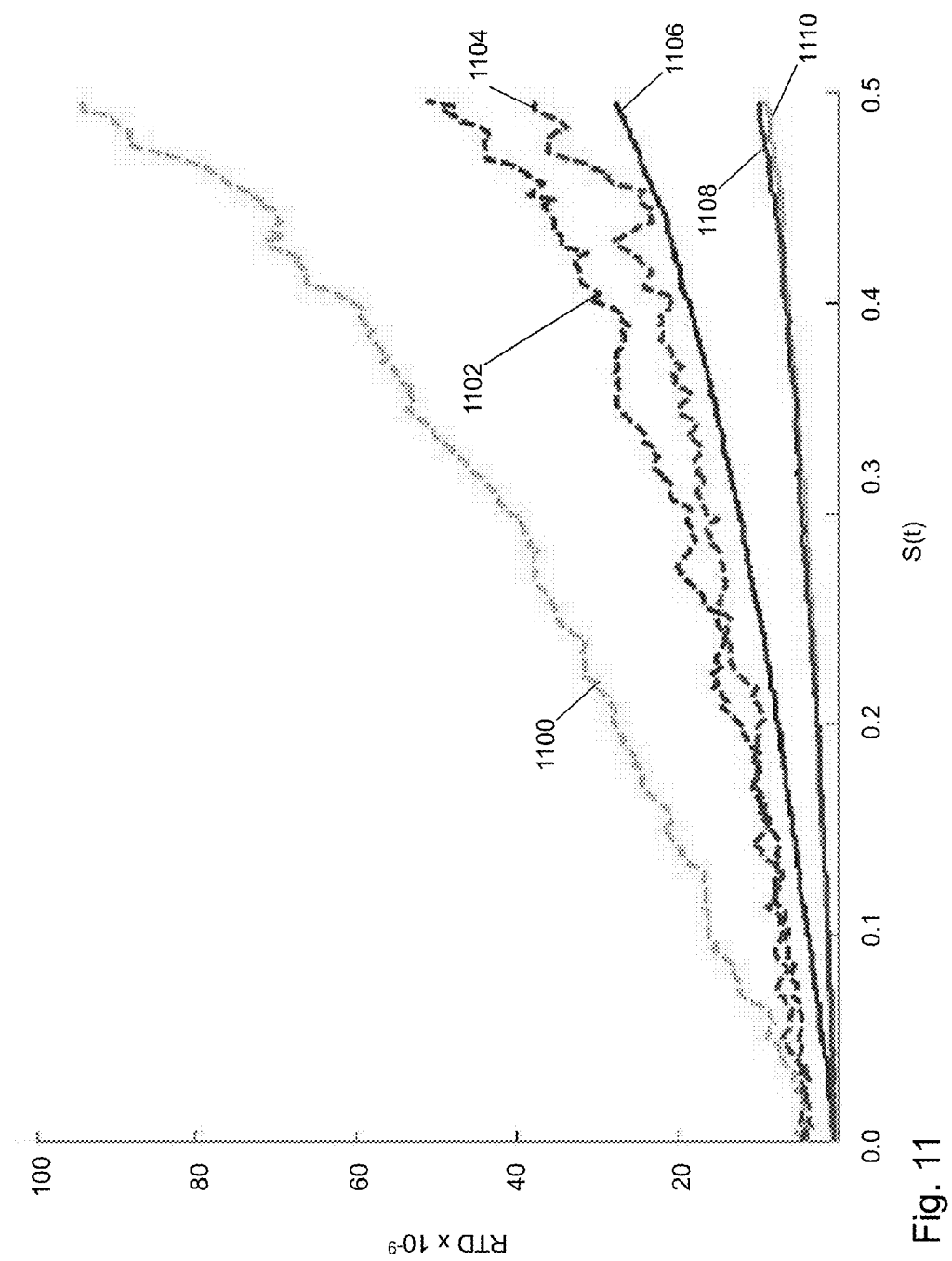
FIG. 11 shows a graph comparing the output of oscillator elements of the sensing system in accordance with a fourth illustrative embodiment.

FIG. 11 shows RTD as a function of an input signal for N=3 oscillator elements and M=2 oscillators with an alternating polarity for the input to oscillator element 2,1 with a noise intensity of $1.0e^{-008}$. A first curve 1000 shows output 734 from oscillator element 2,2. A second curve 1002 shows output 734 from oscillator element 1,2. A third curve 1004 shows output 734 from oscillator element 3,2. A fourth curve 1004 shows output 734 from oscillator element 1,1. A fifth curve 1006 shows output 734 from oscillator element 3,1. A sixth curve 1008 shows output 734 from oscillator element 2,1.

Figure 12:
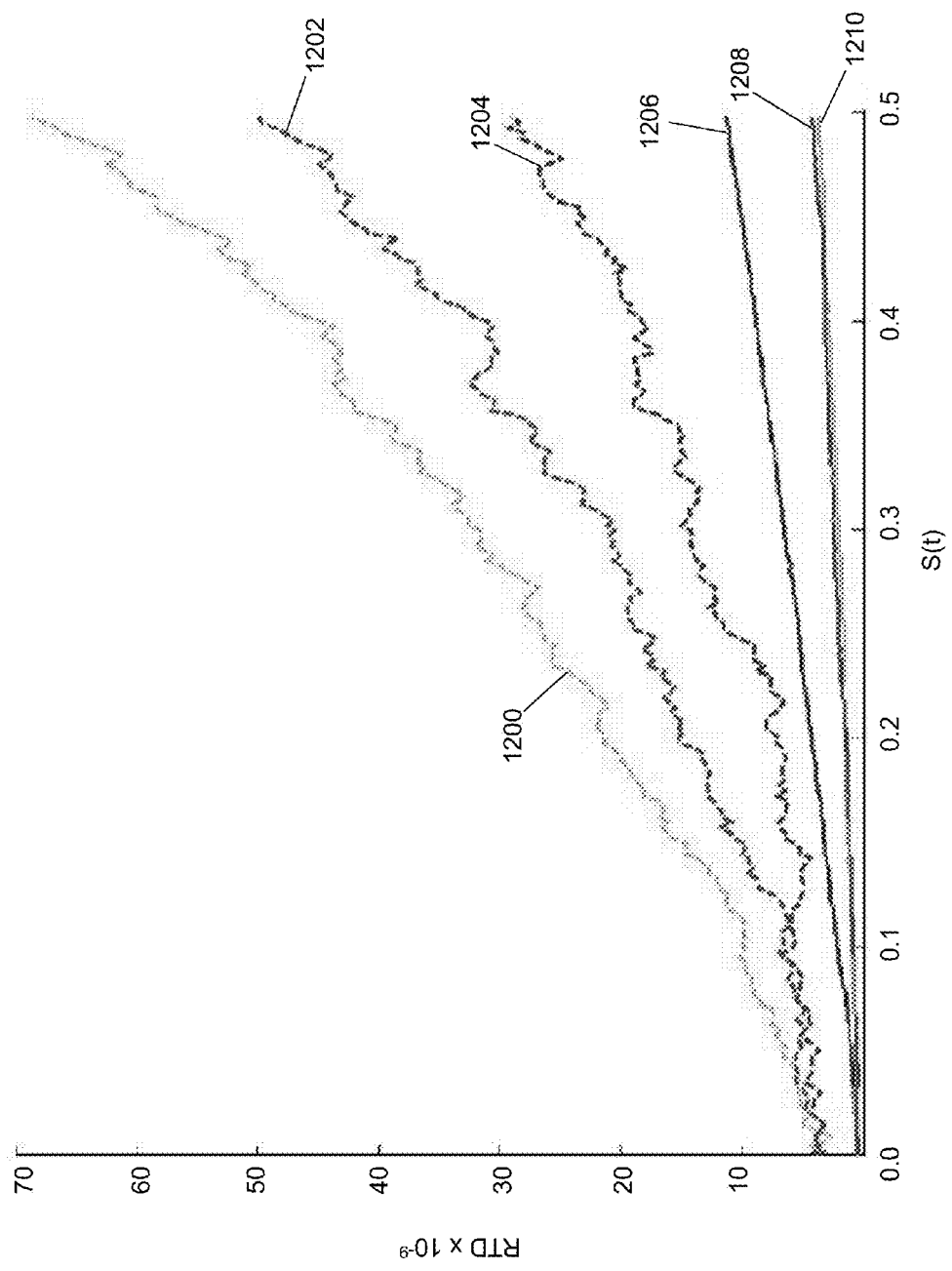
FIG. 12 shows a graph comparing the output of oscillator elements of the sensing system in accordance with a fifth illustrative embodiment.

FIG. 12 shows RTD as a function of an input signal for N=3 oscillator elements and M=2 oscillators with an alternating polarity for the input to oscillator element 2,1 with a noise intensity of $3.1623e^{-008}$. A first curve 1000 shows output 734 from oscillator element 2,2. A second curve 1002 shows output 734 from oscillator element 3,2. A third curve 1004 shows output 734 from oscillator element 1,2. A fourth curve 1004 shows output 734 from oscillator element 1,1. A fifth curve 1006 shows output 734 from oscillator element 3,1. A sixth curve 1008 shows output 734 from oscillator element 2,1. When noise is added to the input signal to simulate real world environment, the enhancement is even greater when comparing the outputs from the first array to the second array.

In these results, oscillator element 2,2 of second oscillator 200,2 performed best. For first oscillator 200,1, oscillator element 1,1 always performed better than oscillator element 2,1 and oscillator element 3,1.

As has been described, in an illustrative embodiment, a cascaded oscillator array is provided. The cascaded array oscillator includes, but is not limited to, a first oscillator array and a second oscillator array. The first oscillator array includes at least three oscillator elements coupled unidirectionally in a first ring such that the first oscillator array outputs a first oscillating signal. Each of the at least three oscillator elements is coupled to receive a signal from a sensing element. The second oscillator array includes at least three oscillator elements coupled unidirectionally in a second ring such that the second oscillator outputs a second oscillating signal. A first number of the at least three oscillator elements of the first oscillator is the same as a second number of the at least three oscillator elements of the second oscillator. Each oscillator element of the at least three oscillator elements of the second oscillator is coupled to receive an output signal from a single oscillator element of the at least three oscillator elements of the first oscillator.

In another illustrative embodiment, a sensor is provided. The sensor includes, but is not limited to, a sensing element, a first oscillator, and a second oscillator. The sensing element is configured to sense a physical characteristic. The first oscillator includes at least three oscillator elements coupled unidirectionally in a first ring such that the first oscillator outputs a first oscillating signal. Each of the at least three oscillator elements is coupled to receive a signal from the sensing element. The second oscillator includes at least three oscillator elements coupled unidirectionally in a second ring such that the second oscillator outputs a second oscillating signal. A first number of the at least three oscillator elements of the first oscillator is the same as a second number of the at least three oscillator elements of the second oscillator. Each oscillator element of the at least three oscillator elements of the second oscillator is coupled to receive an output signal from a single oscillator element of the at least three oscillator elements of the first oscillator.

In yet another illustrative embodiment, a sensor system is provided. The sensor system includes, but is not limited to, a first sensor and a second sensor. The first sensor includes, but is not limited to, a first sensing element, a first oscillator, and a second oscillator. The first sensing element is configured to sense a first physical characteristic. The first oscillator includes at least three oscillator elements coupled unidirectionally in a first ring such that the first oscillator outputs a first oscillating signal. Each of the at least three oscillator elements is coupled to receive a first signal from the first sensing element. The second oscillator includes at least three oscillator elements coupled unidirectionally in a second ring such that the second oscillator outputs a second oscillating signal. A first number of the at least three oscillator elements of the first oscillator is the same as a second number of the at least three oscillator elements of the second oscillator. Each oscillator element of the at least three oscillator elements of the second oscillator is coupled to receive an output signal from a single oscillator element of the at least three oscillator elements of the first oscillator.

The second sensor includes, but is not limited to, a second sensing element, a third oscillator, and a fourth oscillator. The second sensing element is configured to sense a second physical characteristic. The third oscillator includes at least three oscillator elements coupled unidirectionally in a third ring such that the third oscillator outputs a third oscillating signal. Each of the at least three oscillator elements of the third oscillator is coupled to receive a second signal from the second sensing element. The fourth oscillator includes at least three oscillator elements coupled unidirectionally in a fourth ring such that the fourth oscillator outputs a fourth oscillating signal. A third number of the at least three oscillator elements of the third oscillator is the same as a fourth number of the at least three oscillator elements of the fourth oscillator. Each oscillator element of the at least three oscillator elements of the fourth oscillator is coupled to receive an output signal from a single oscillator element of the at least three oscillator elements of the third oscillator.

The word "illustrative" is used herein to mean serving as an illustrative, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

It will be understood that many additional changes in the details, materials, steps and arrangement of parts, which have been herein described and illustrated to explain the nature of the invention, may be made by those skilled in the art within the principle and scope of the invention as expressed in the appended claims. The foregoing description of illustrative embodiments of the disclosed subject matter has been presented for purposes of illustration and of description. It is not intended to be exhaustive or to limit the disclosed subject matter to the precise form disclosed, and modifications and variations are possible in light of the above teachings or may be acquired from practice of the disclosed subject matter. The embodiments were chosen and described in order to explain the principles of the disclosed subject matter and as practical applications of the disclosed subject matter to enable one skilled in the art to utilize the disclosed subject matter in various embodiments and with various modifications as suited to the particular use contemplated. It is intended that the scope of the disclosed subject matter be defined by the claims appended hereto and their equivalents.

What is claimed is:

1. A cascaded oscillator array comprising:
    a first oscillator array comprising at least three oscillator elements coupled unidirectionally in a first ring such that the first oscillator array outputs a first oscillating signal, wherein each of the at least three oscillator elements is coupled to receive a signal from a sensing element; and
    a second oscillator array comprising at least three oscillator elements coupled unidirectionally in a second ring such that the second oscillator array outputs a second oscillating signal, wherein a first number of the at least three oscillator elements of the first oscillator array is the same as a second number of the at least three oscillator elements of the second oscillator array, further wherein each oscillator element of the at least three oscillator elements of the second oscillator array is coupled to receive an output signal from a single oscillator element of the at least three oscillator elements of the first oscillator.

2. The cascaded oscillator array of claim 1, wherein each oscillator element of the at least three oscillator elements of the first oscillator is a nonlinear, over-damped, bistable element.

3. The cascaded oscillator array of claim 1, wherein the first number is odd.

4. The cascaded oscillator array of claim 1, wherein the signal received from the sensing element is a direct current (DC) signal.

5. The cascaded oscillator array of claim 1, wherein the signal received from the sensing element is an alternating current (AC) signal.

6. The cascaded oscillator array of claim 4, wherein the signal received from the sensing element is a DC current.

7. The cascaded oscillator array of claim 1, wherein at least three oscillator elements of the first oscillator comprise a first oscillator element, a second oscillator element, and a third oscillator element, wherein the first ring unidirectionally couples the first oscillator element to receive an input from the second oscillator element, the second oscillator element to receive an input from the third oscillator element, and the third oscillator element to receive an input from the first oscillator element.

8. The cascaded oscillator array of claim 7, wherein the at least three oscillator elements of the second oscillator array comprise a fourth oscillator element, a fifth oscillator element, and a sixth oscillator element, wherein the second ring unidirectionally couples the fifth oscillator element to receive an input from the fourth oscillator element, the sixth oscillator element to receive an input from the fifth oscillator element, and the fourth oscillator element to receive an input from the sixth oscillator element.

9. The cascaded oscillator array of claim 8, wherein the fourth oscillator element is coupled to receive a first output from the first oscillator element, the fifth oscillator element is coupled to receive a second output from the second oscillator element, and the sixth oscillator element is coupled to receive a third output from the third oscillator element.

10. The cascaded oscillator array of claim 9, wherein a polarity of the signal from the sensing element input to the second oscillator is reversed.

11. The cascaded oscillator array of claim 10, wherein the second oscillating signal is output from the fifth oscillator element.

12. The cascaded oscillator array of claim 9, wherein the second oscillating signal is output from the fifth oscillator element.

13. The cascaded oscillator array of claim 9, further comprising:
a third oscillator comprising at least three oscillator elements coupled unidirectionally in a third ring such that the third oscillator outputs a third oscillating signal, wherein a third number of the at least three oscillator elements of the third oscillator is the same as the first number, further wherein each oscillator element of the at least three oscillator elements of the third oscillator is coupled to receive a second output signal from a single oscillator element of the at least three oscillator elements of the second oscillator.

14. The cascaded oscillator array of claim 13, wherein the at least three oscillator elements of the third oscillator comprise a seventh oscillator element, an eighth oscillator element, and a ninth oscillator element, wherein the third ring unidirectionally couples the seventh oscillator element to receive an input from the eighth oscillator element, the eighth oscillator element to receive an input from the ninth oscillator element, and the ninth oscillator element to receive an input from the seventh oscillator element.

15. The cascaded oscillator array of claim 14, wherein the seventh oscillator element is coupled to receive a fourth output from the fourth oscillator element, the eighth oscillator element is coupled to receive a fifth output from the fifth oscillator element, and the ninth oscillator element is coupled to receive a sixth output from the sixth oscillator element.

16. The cascaded oscillator array of claim 1, wherein each oscillator element of the at least three oscillator elements of the second oscillator is a nonlinear, over-damped, bistable element.

17. A sensor comprising:
a sensing element configured to sense a physical characteristic;
a first oscillator comprising at least three oscillator elements coupled unidirectionally in a first ring such that the first oscillator outputs a first oscillating signal, wherein each of the at least three oscillator elements is coupled to receive a signal from the sensing element; and
a second oscillator comprising at least three oscillator elements coupled unidirectionally in a second ring such that the second oscillator outputs a second oscillating signal, wherein a first number of the at least three oscillator elements of the first oscillator is the same as a second number of the at least three oscillator elements of the second oscillator, further wherein each oscillator element of the at least three oscillator elements of the second oscillator is coupled to receive an output signal from a single oscillator element of the at least three oscillator elements of the first oscillator.

18. The sensor of claim 17, further comprising an input interface configured to convert the sensed physical characteristic to a current signal, wherein the signal received from the sensing element is the current signal.

19. The sensor of claim 17, further comprising an output interface, wherein the second oscillating signal is a differential output signal, and the output interface is configured to convert the differential output signal to a single output signal.

20. A sensor system comprising:
a first sensor comprising
a first sensing element configured to sense a first physical characteristic;
a first oscillator comprising at least three oscillator elements coupled unidirectionally in a first ring such that the first oscillator outputs a first oscillating signal, wherein each of the at least three oscillator elements is coupled to receive a first signal from the first sensing element; and
a second oscillator comprising at least three oscillator elements coupled unidirectionally in a second ring such that the second oscillator outputs a second oscillating signal, wherein a first number of the at least three oscillator elements of the first oscillator is the same as a second number of the at least three oscillator elements of the second oscillator, further wherein each oscillator element of the at least three oscillator elements of the second oscillator is coupled to receive an output signal from a single oscillator element of the at least three oscillator elements of the first oscillator; and
a second sensor comprising
a second sensing element configured to sense a second physical characteristic;
a third oscillator comprising at least three oscillator elements coupled unidirectionally in a third ring such that the third oscillator outputs a third oscillating signal, wherein each of the at least three oscillator elements is coupled to receive a second signal from the second sensing element; and
a fourth oscillator comprising at least three oscillator elements coupled unidirectionally in a fourth ring such that the fourth oscillator outputs a fourth oscillating signal, wherein a third number of the at least three oscillator elements of the third oscillator is the same as a fourth number of the at least three oscillator elements of the fourth oscillator, further wherein each oscillator element of the at least three oscillator elements of the fourth oscillator is coupled to receive an output signal from a single oscillator element of the at least three oscillator elements of the third oscillator.

* * * * *